(12) United States Patent
Barth et al.

(10) Patent No.: US 7,449,637 B2
(45) Date of Patent: Nov. 11, 2008

(54) PULSE CURRENT SENSOR

(76) Inventors: Jon E. Barth, 1589 Foothill Dr., Boulder City, NV (US) 89005-2718; John R. Richner, 1589 Foothill Dr., Boulder City, NV (US) 89005-2718

( * ) Notice: Subject to any disclaimer, the term of this patent is extended or adjusted under 35 U.S.C. 154(b) by 0 days.

(21) Appl. No.: 11/469,800

(22) Filed: Sep. 1, 2006

(65) Prior Publication Data

US 2007/0115008 A1    May 24, 2007

Related U.S. Application Data

(60) Provisional application No. 60/596,131, filed on Sep. 1, 2005.

(51) Int. Cl.
*H01R 4/02* (2006.01)
(52) U.S. Cl. .................................... 174/88 C
(58) Field of Classification Search ........... 174/36, 174/88 C; 324/713
See application file for complete search history.

(56) References Cited

U.S. PATENT DOCUMENTS

| | | | |
|---|---|---|---|
| 2,423,447 A | 7/1947 | Grimm | |
| 3,243,704 A | 3/1966 | Jarger | |
| 3,609,541 A | 9/1971 | Scott | |
| 3,646,440 A | 2/1972 | Wilhelm | |
| 4,584,525 A | 4/1986 | Harnden | |
| 5,467,013 A | 11/1995 | Williams | |
| 5,583,429 A | 12/1996 | Otaka | |
| 5,818,243 A * | 10/1998 | Wakamatsu | 324/649 |
| 6,664,474 B1 * | 12/2003 | Gunnels | 174/75 C |
| 2004/0021454 A1 * | 2/2004 | Jevtic et al. | 324/72.5 |
| 2004/0135590 A1 * | 7/2004 | Quon | 324/713 |

* cited by examiner

*Primary Examiner*—Chau N Nguyen
(74) *Attorney, Agent, or Firm*—Kenehan & Lambertsen, Ltd.; John C. Lambertsen

(57) ABSTRACT

A sensor measures the current in high frequency pulses (e.g., pulses having fast rise times) that are transported on coaxial transmission lines. The sensor includes an entrance coaxial conductor and an exit coaxial conductor that are interconnected by a continuous inner conductor. The outer conductors of the two coaxial conductors are interrupted and are interconnected by a sensing resistor with a substantially constant resistance. An output sensor coaxial conductor has an inner conductor electrically connected to a first end of the sensing resistor and has an outer conductor connected to a second end of the sensing resistor. Tapered ferrite cores are placed around the three coaxial conductors proximate the connections to the sensing resistor. Preferably, the sensing resistor is a tubular resistor formed on a dielectric cylindrical tube. The sensor is enclosed within a continuous conductive housing.

12 Claims, 5 Drawing Sheets

PULSE CURRENT SENSOR

RELATED APPLICATIONS

The present application claims the benefit of priority under 35 U.S.C. § 119(e) to U.S. Provisional Application No. 60/596,131, filed on Sep. 1, 2005.

BACKGROUND OF THE INVENTION

1. Field of the Invention

The present invention is in the field of measurement of currents produced by pulses having fast rise times.

2. Description of the Related Art

Fast-pulsed power measurements and sensors to make these measurements were needed in the atomic age, where researchers needed to monitor fast high voltage signals produced by Compton diode radiation sensors located close to nuclear explosions. The Compton diode provided voltage waveforms greater than 10,000 volts which were analyzed to determine details of the nuclear chain reaction. To "freeze" the many details of the reaction requires fast accurate voltage measurements on the order of a nanosecond or less. Much high power pulse instrumentation is largely the result of the technology developed for government laboratories weapons research.

The technology developed for those measurements now finds use in the semiconductor industry. Microprocessor circuitry is incredibly complex and very sensitive to uncontrolled pulses of energy, such as static electric discharges (Electrostatic Discharge Voltages—"ESD"). Protection circuits are required on every connection which every microprocessor makes to the outside world, and these circuits must be tested. A pulse that accurately simulates ESD is applied to the protection circuit. The voltages and currents reacting with this protective circuit are monitored at pulse amplitudes up through circuit failure. The information obtained during the tests is used to assess the efficacy of each protection circuit design as well as to obtain information needed to improve future protection circuits.

High frequency RF signals or fast pulses in the time domain are usually transported on coaxial transmission lines. In most cases voltage measurement on the line (which is easily accomplished) provides a reasonably close (calculated) value for the current in the line throughout the total pulse. The accuracy of the current calculation requires the measurement of voltage values over a narrow resistance range. When using a 50-ohm coax transmission line, the greatest accuracy for the calculated current values occurs for resistance values in the immediate vicinity of 50 ohms. The testing of ESD protective circuits in semiconductors encounters resistance values that can vary between 1 and 10,000 ohms. As a consequence, obtaining accurate values for voltage and current over this entire dynamic resistance range requires that voltage values and current values both be actually measured, preferably with accuracies of approximately 1% or better.

The present environment of this current sensor relates to the generation and measurement of electrical signals that are intended to simulate electrostatic discharge (ESD) voltages across and current pulses through semiconductors. ESD pulses are regularly observed with rise times of 0.1 nanosecond or less, and having durations as long as a few hundred microseconds. Other electrical overstress threats are of a longer duration, up to 1 millisecond or more.

Additional design constraints are provided by the requirements of the expensive digitizers (similar to oscilloscopes) used to display this current and voltage data. To optimally use their capabilities requires that the sensor speed be about three times faster than the digitizer. In the ESD environment, this requires sensors capable of providing data with 20- to 30-picosecond rise times to the digitizer. Additionally, the sensors must measure pulse time durations of up to one microsecond or longer. These conflicting requirements present problems to the prior art sensors.

In a coaxial transmission line, current flows on both conductors in equal but opposite amplitudes, not just on the inner conductor as is sometimes believed. One type of current sensor, the current transformer, places the sensing element between the inner and outer conductors of the coaxial transmission line. The opposite currents flowing through the two conductors produce a magnetic field between them, which couples to a toroidal magnetic (e.g., ferrite) core placed between the two conductors. A multi-turn winding on the ferrite core provides an output voltage that is proportional to current flow in the coaxial line. However, the parasitic inductances and capacitances in the windings limit its accuracy over the time periods needed for ESD measurements.

A similar current sensor eliminates the windings and utilizes a magnetic core having a gap where the field is concentrated. A Hall-effect sensor is placed in the gap to measure the field. U.S. Pat. No. 5,583,429 to Otaka discloses such a current measuring method. Hall-effect sensors are both insensitive and slow—their fastest response time of slightly faster than one microsecond renders them unable to be used for faster pulse current measurements. Additionally, the split ring ferrite core distorts the current flowing inside the coaxial transmission line, making a meaningful measurement all the more difficult.

A still further variation is the Rogowski coil, in which the coil couples to the magnetic field without a magnetic core. The Rogowski coil is constructed as a constant impedance transmission line wound around a center conductor, which enables measurement of the fastest parts of the current. However, inherent inductive and capacitive parasitics in the windings result in an objectionable broad band resonance at the end of the pulse, which seriously limits the measurements fidelity of long pulses.

Another family of current sensors, known as "current viewing resistors," utilizes resistors placed in the outer conductor to obtain current measurements. There are several variations. In one variation, an end-of-line sensor places a current sensing resistor in the outer conductor at the end or beginning of a transmission line where one terminal of the resistor can be grounded. The current sensing resistor is typically cylindrical and is grounded on one end. Accordingly, capacitive currents to ground on the return side, which could distort the signal propagating along the coaxial cable, are eliminated. U.S. Pat. No. 3,646,440 to Wilhelm discloses such an end-of-line current sensor resistor.

The non-constant impedance and torturous current flow path of the Wilhelm '440 sensor could not provide sub-nanosecond rise time measurement capabilities. In fact, the Wilhelm '440 description identifies the response requirements as being one microsecond. Other current viewing resistors produced by T & M Associates of Albuquerque, N. Mex., provide much faster pulse responses, including some embodiments having response capabilities of a few nanoseconds.

Very high-speed coaxial line current sensors have also utilized in-line resistors, which measure current across a short section of high impedance line inserted into the outer conductor. This current sensing method differentiates the current waveform and effectively eliminates the low frequency or slow speed time domain part of the signal. After the sensed signal is coupled to the measuring circuit, the measured signal must be integrated to recover the true current waveform at longer times. This integration essentially recovers the low frequency part of the waveform along with the high speed part; but loses the base line reference, which poses a problem when seeking accurate current measurements.

Additionally, passive high-speed integrators have limited rise time capabilities, which in turn limit the fastest rise time capability of the total measurement. The fastest passive integrators have undistorted rise time limitations of about 0.5 nanosecond. Calibration of integrators has limitations of about 5% to 10% at best, further limiting the accuracy of the integrated signal. For long time response, the time for a specific amount of droop at long time is also limited in a passive integrator by reasonable capacitor values.

U.S. Pat. No. 2,423,447 to Grimm uses a cylindrical resistor in series with the outer conductor of a coaxial line. This resistor is kept short and small (compared to the measurement wavelength) to minimize the distortion caused to the current flowing in the coaxial line. After sensing the current in the outer conductor as a voltage, the signal is then rectified to convert it to a DC signal, which achieves isolation from the current sensing resistor so that it can be taken to an external location for monitoring. A shunt capacitor shunts RF signals to ground while allowing the DC signal to pass through to the external indicating meter.

As disclosed by Grimm '447, the DC meter, which indicates RF current passing through the sensing resistor after the conversion elements change RF current to DC current, must be located close to the current source to achieve accurate measurements. If Grimm '447 had isolated the current sensing resistor with the (now) more commonly-used series isolation resistors, followed by RF blocking capacitors to the common return, the remote DC measurement could have been placed at any distance from the current sensing resistor without disturbing the signals on the coaxial transmission line.

The Grimm '447 resistor is not entirely coaxial, and thus presents some amount of impedance discontinuity with respect to the coaxial transmission line, which causes minor signal reflections at the frequencies used for this circuit. Grimm '447 also does not place a shield around the current sensing resistor and detection circuit, which will cause this circuit to be sensitive to either RF or DC noise currents, picked up on the coaxial cable that may flow through his current sensing resistor. Small amounts of DC or noise voltage present at opposite ends of a coaxial cable will cause noise currents to flow through the current sensing resistor and produce errors in the coaxial cable current measurement.

Grimm '447 converts the sensed signal into a DC signal, which allows the sensed signal to be transported a limited distance beyond the current viewing resistor without disturbing the sensing circuit or elements. To obtain accurate pulse current measurements requires that pulse current signal remain in its original condition, which maintains the original waveform parameters.

Another in-line resistor sensor is disclosed in U.S. Pat. No. 3,243,704 to Jarger et al. A cylindrical resistor in series with the outer conductor forms the current sensing element used by the RF reflectometer of Jarger et al. '704. A shielded container houses the current sensing element to protect it from noise currents that may travel on the coaxial cable shield, shunting any noise currents around the sensing resistor circuit. Like Grimm '447, Jarger et al. '704 converts the sensed signal to DC and then uses series resistor and shunt capacitor isolation to transport the DC signals out of the shielded box.

The Jarger et al. '704 reflectometer places a ferrite toroid at each side of the coaxial line where it leaves the shielded box to isolate the current sensing resistor from the ground return of the shielded container. This ferrite placement is entirely appropriate for the Jarger et al. '704 low frequency signals (approximately 30 MHz), which have an equivalent rise time of about 10 nanoseconds. The limited capacitance effects at 30 MHz resulting from the length of coaxial cables between the current sensing resistor and the ferrites placement are not likely to cause distortion of the sensed signal throughout the Jarger et al. '704 frequency range of interest. For pulse shapes having rise times that are one or more orders of magnitude faster, such capacitance effects cannot be ignored.

Fast time domain signals and extremely high RF signals present design problems not found in the low frequencies of Jarger et al. '704. For example, the Jarger et al. '704 reflectometer places a 90-degree corner in the coaxial line between the ferrites and the current sensing resistor. Additionally, the series current sensors of Grimm '447 and Jarger et al. '704 do not seek to maintain a constant impedance in the coaxial line carrying the current to be sensed, which is required to avoid generating reflections in the current sensing resistor area of the coaxial transmission line that risk changing the pulse waveform before it is measured.

SUMMARY OF THE INVENTION

A need exists for accurately measuring current values of high frequency RF signals—fast pulses in the time domain, over an entire dynamic resistance range during the testing of ESD protective circuits.

The present invention makes use of ferrite cores to isolate both ends of the coaxial current sense resistor from its DC ground connections and to isolate the controlled impedance sensed output coaxial cable from its DC ground connection while it transports the sensed current signal to a distant location. No DC conversion of the sensed signal is required, which enables the transport of undistorted, extremely fast time domain or extremely high RF signals from the current sensing resistor to a remote location in its original form or waveshape. By adding magnetic isolation elements to the present sensor, accurate measurements for coaxial current waveforms over a 0.1 nanosecond to 1 millisecond range are obtained.

In yet a further aspect of the present invention, for very high-speed time domain measurements, significant (90 degrees in Jarger et al. '704) angular bends in the large coaxial lines used, induce non-uniform pulse response characteristics in the rise time—both in the initial rise portion and slightly thereafter. For the fastest possible current measurements it is important that the entire coaxial sensing resistor assembly and isolation elements lie in a straight line.

In a still further aspect of the present invention, ferrite toroid placement is also important when attempting to measure extremely high-speed time domain pulses. To minimize capacitance effects it is important that the ferrites be located in open air—and, as much as possible, widely spaced from each wall of the surrounding grounded low-resistance metal housing.

To achieve the fastest rise time current measurement, all conductors carrying the signal away from the current sensing resistor must be isolated from all external conductors, which allows the greatest percentage of fast rise time parts of the signal to be conducted into the signal output coax. The high frequency ferrites are placed as close as possible to the resistive film sensor. Additionally, to minimize both dielectric and magnetic losses inherent in all ferrites, the ends of the ferrite toroids located nearest the current sensing resistor (for all three coaxial connections) are tapered to as small an outer diameter as possible. This technique improves the fidelity of this current sensor to obtain the fastest possible rise time pulse response.

In a still further aspect of the present invention, careful dimensioning (for the fastest rise time desired to be measured) of the diameters of the inner conductor and the present current sensing resistor and the dielectric constant of its substrate for its placement in series with the outer conductor of the transmission line permits the retention of constant 50-ohm impedance throughout the measuring section of the transmission line.

Some further objects and advantages of the present invention shall become apparent from the ensuing description and as illustrated in the accompanying drawings.

BRIEF DESCRIPTIONS OF THE DRAWINGS

Certain embodiments in accordance with the present invention are described below in connection with the accompanying drawing figures in which.

DETAILED DESCRIPTIONS OF PREFERRED EMBODIMENTS

Figure 1:
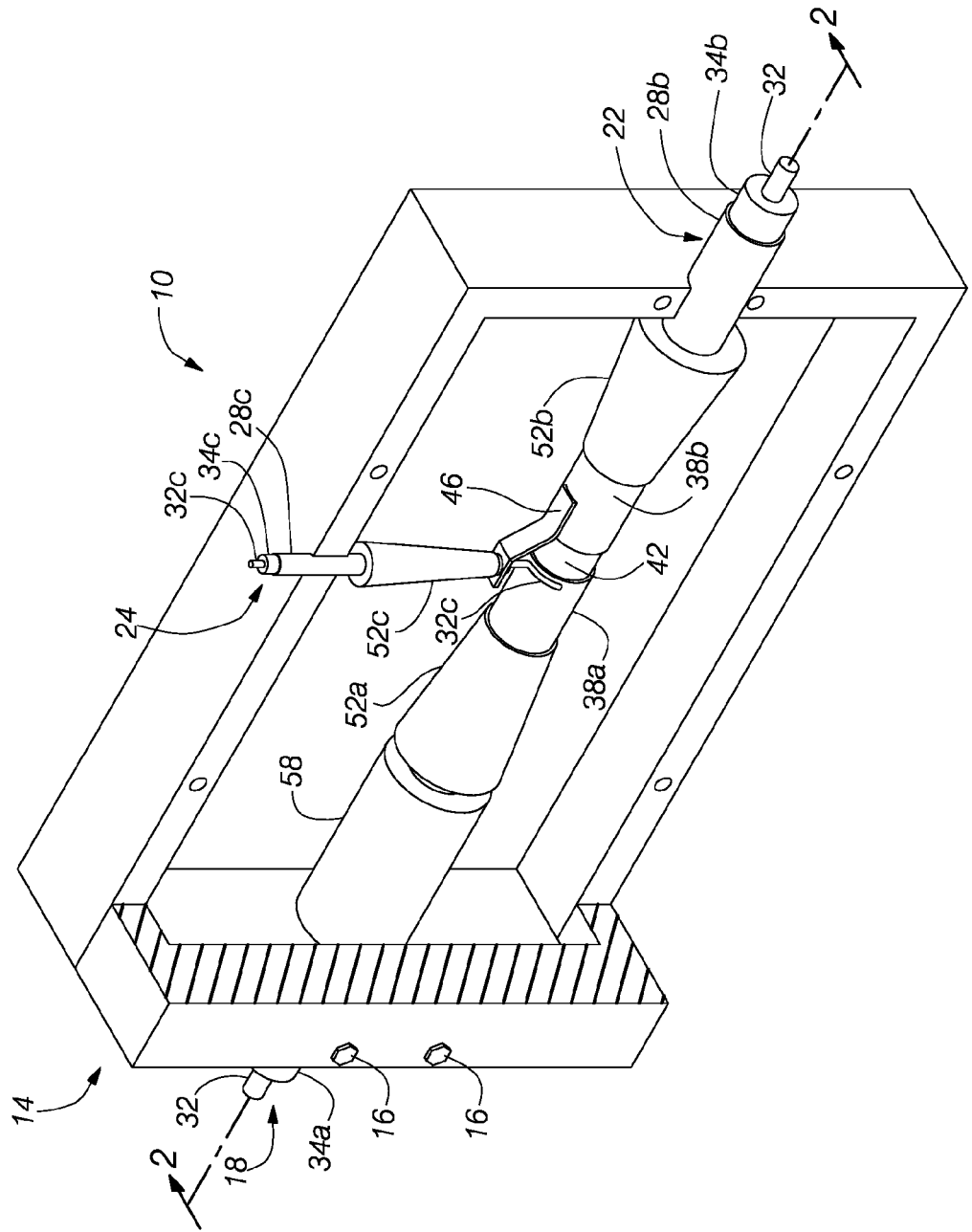
FIG. 1 illustrates a partial perspective view, with portions removed, of a shielded pulse current sensor in accordance with the present invention.

The following description and the accompanying drawings illustrate exemplary embodiments of a pulse coaxial current sensor. The description and drawings are intended to be illustrative of the inventions defined in the appended claims. In the drawings, like numerals refer to like parts throughout.

In FIG. 1, a pulse coaxial current sensor 10 utilizes an outer shield box 14 comprising a low-resistance metal, which is electrically and mechanically connected to an entrance coaxial conductor 18, an exit coaxial conductor 22, and a current sensor output (e.g., extraction) coaxial conductor 24. In a preferred embodiment, the metal shield box 14 comprises matched halves that are removablly attached together utilizing a plurality of fasteners 16.

Figure 2:
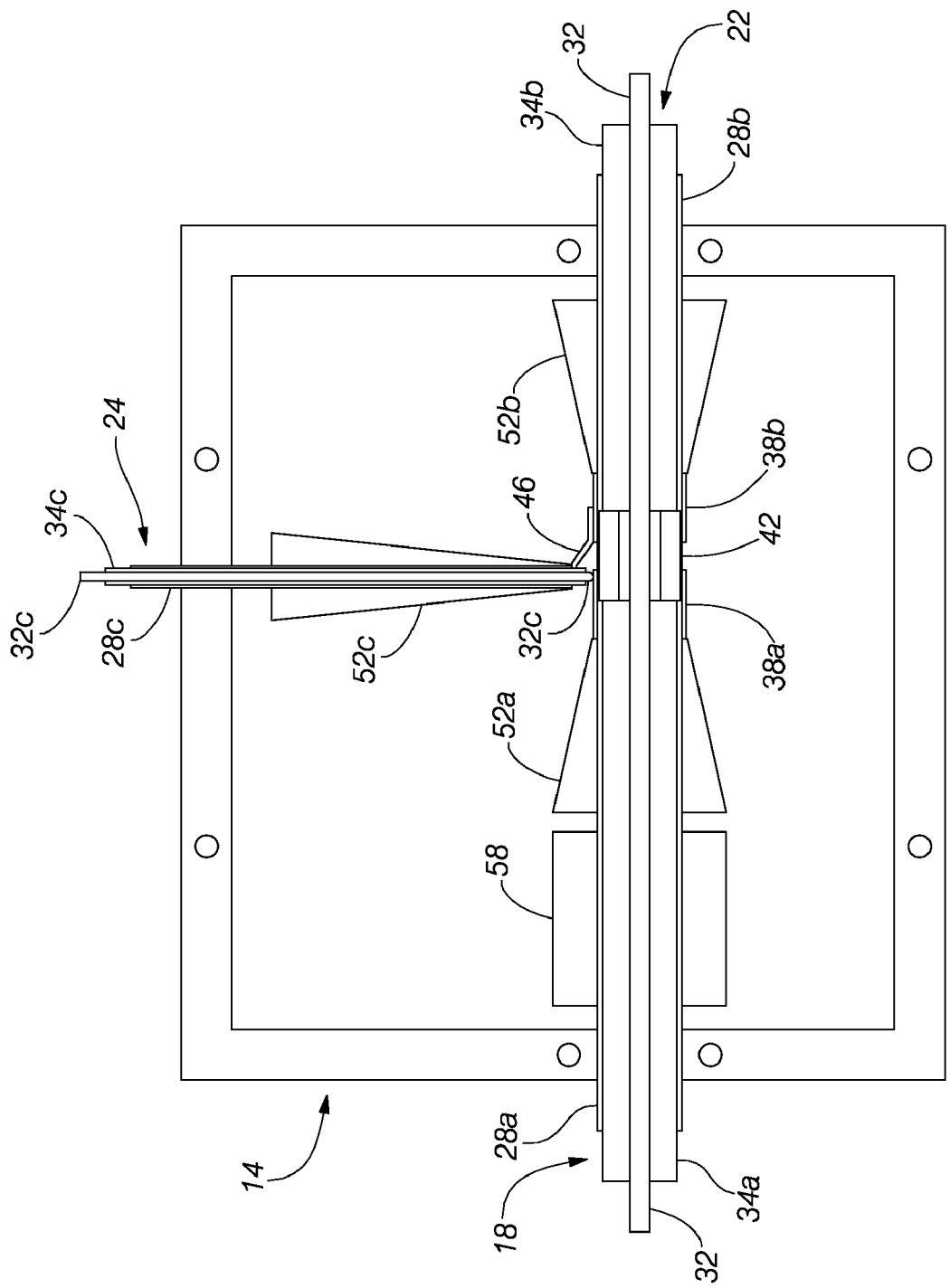
FIG. 2 illustrates a cross-sectional view, taken along the line 2-2 in FIG. 1, of a shielded pulse current sensor in accordance with the present invention.

The entrance coaxial conductor 18 comprises an outer conductor 28a and an inner conductor 32. The outer conductor 28a and the inner conductor 32 are separated by an inner insulator 34a. The exit coaxial conductor 22 comprises an outer conductor 28b and the inner conductor 32, which is preferably continuous through the pulse current sensor 10, and is common to the coaxial conductor 18 and the coaxial conductor 22. The outer conductor 28b and the inner conductor 32 are separated by an inner insulator 34b. The current sensor output coaxial conductor 24 comprises an outer conductor 28c and an inner conductor 32c. The outer conductor 28c and the inner conductor 32c are separated by an inner insulator 34c. As shown in FIG. 2 and as discussed hereinafter, the outer conductors 28a, 28b of the coaxial conductors 18 and 22 are not continuous while the inner conductor 32 of both conductors 18 and 22 is preferably continuous through the pulse current sensor 10. In the illustrated embodiment, the coaxial conductors 18 and 22 comprise a single 50-ohm transmission line having the inner conductor 32 and having an intermediate portion of the outer shield removed to form the outer conductor 28a and the outer conductor 28b as separate outer conductors. As shown in the drawings, the current sensor output coaxial conductor 24 advantageously has a smaller diameter than the coaxial conductors 18 and 22, while preferably also having an impedance of 50 ohms.

Each of the outer conductors 28a, 28b terminates within the shield box 14 at a separate one of a pair of resistor conductors 38a, 38b. The resistor conductors 38a, 38b are electrically and mechanically secured to opposite ends of a high-frequency current sensing resistor 42, which advantageously has a resistance of approximately one ohm. The voltage developed across the current sensing resistor 42 is conducted to the output coaxial conductor 24. Preferably, the inner conductor 32c of the coaxial conductor 24 is soldered directly to the entrance resistor conductor 38a, and the outer conductor 28c of the coaxial conductor 24 is electrically and mechanically attached (preferably soldered) to the exit resistor conductor 38b with a thin metal connective strap 46

The electrical and mechanical connections of the outer metal shield box 14 to the outer conductors 28a, 28b, 28c of the entrance, exit and current sensor output coaxial conductors 18, 22, 24 provide very low resistances to shunt any noise currents away from the current sensing resistor 42. The ability to retain the fastest possible rise time pulse information into the output coaxial conductor 24 is accomplished by minimizing the electrical lengths of the current sensing resistor 42 to an absolute minimum, and by positioning the metallic connections to the current sensing resistor 42 (the attachment of the center conductor 32c to the entrance resistor conductor 38a and the attachment of the metal connective strap 46 attachment to the exit resistor connector 38b) at the maximum distance from each of the inner walls of the metal shield box 14 (e.g., at a distance of at least approximately five times the outer diameters of the outer conductors 28a, 28b).

As illustrated in the perspective view of FIG. 1, the various coaxial conductors are centrally positioned within the metal shield box 14 to provide the lowest practical value of distributed capacitance. The substantially equal air space between the entrance, exit, and current sensor output coaxial conductors 18, 22, 24 and the non-breached inner surfaces of the metal shield box 14 minimizes the capacitive loading on the output voltage developed on the current sensing resistor 42.

A plurality of tapered toroidal ferrites 52a, 52b, 52c are provided to minimize the current flow out of the junction between the current sensing resistor 42 and current sensor output coaxial conductor 24. A single one from the plurality of tapered ferrites 52a, 52b, 52c is placed around a respective one of the three coaxial conductors 18, 22, 24 at a location on the coaxial conductors that is adjacent the junction. Preferably, the ferrites are high-frequency, high permeability ferrites. As illustrated, each ferrite is positioned on the respective coaxial conductor with the smaller end of the tapered ferrite proximate the respective junction of coaxial conductor with the sensing resistor 42 and with the larger end of the ferrite positioned away from the junction. As illustrated the ferrite 52c advantageously has respective smaller inner and outer diameters to conform to the smaller diameter of the current sensor output coaxial conductor 24. The toroidal ferrites are tapered to minimize the amount of high capacitance material between the coaxial lines and the surrounding grounded shield. The smaller diameters proximate the sensing resistor 42 inhibit the fastest rise time portions of the pulse while minimizing the amount of capacitance added to the coaxial lines closest to the junctions with the current sensing resistor. As the slower portions of the current pulse travel past the smaller diameters of the tapered toroidal ferrites, the slower portions are inhibited by increasingly greater amounts of inductance caused by the increasing diameters of the ferrites.

Using the tapered ferrites 52a, 52b, 52c to isolate the high speed portions of the signals from the junction formed by the current sensing resistor 42 and the current sensor output coaxial outer conductor 28c, permits the use of ordinary cylindrical ferrite toroids of higher permeability and higher loss at high speed to improve the slow part of the pulse response. As shown in FIGS. 1 and 2, a cylindrical toroidal ferrite 58 is placed around the entrance coaxial conductor 18 at a location that is isolated from the resistor 42 by the tapered ferrite 52a.

Figure 5:
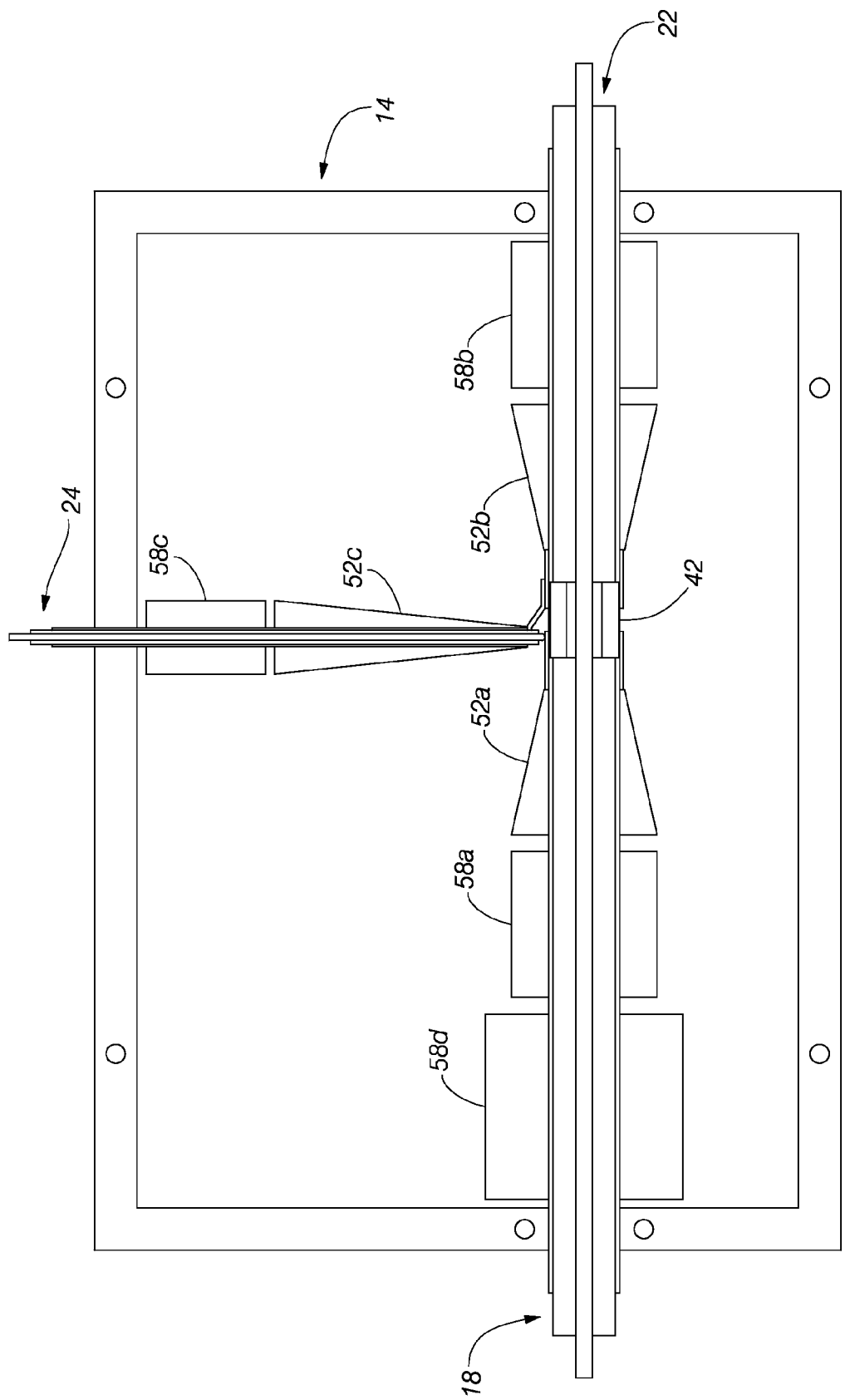
FIG. 5 illustrates a cross-sectional view, similar to FIG. 2, showing additional non-tapered ferrite toroids between the tapered ferrite toroids and the walls of the housing.

The positioning of the cylindrical toroidal ferrite 58 in FIGS. 1 and 2 is possible because when the toroidal ferrite is so located, the capacitance to ground will not degrade the faster rise times. FIG. 5 illustrates a further embodiment wherein a respective cylindrical toroidal ferrite 58a, 58b, 58c is positioned between the respective larger end of each of each of the tapered ferrites 52a, 52b, 52c and the respective wall of the metal shield 14. If a longer pulse response is required, a fourth cylindrical toroidal ferrite 58d having a larger diameter and an even higher loss is advantageously added between the cylindrical ferrite toroid 58a and the wall of the outer metal shield 14. For example, the larger cylindrical toroidal ferrite 58d may advantageously comprises high permeability metal tape wound cores. As illustrated in FIG. 5, the metal shield 14 is enlarged to accommodate the additional toroids.

Figure 3:
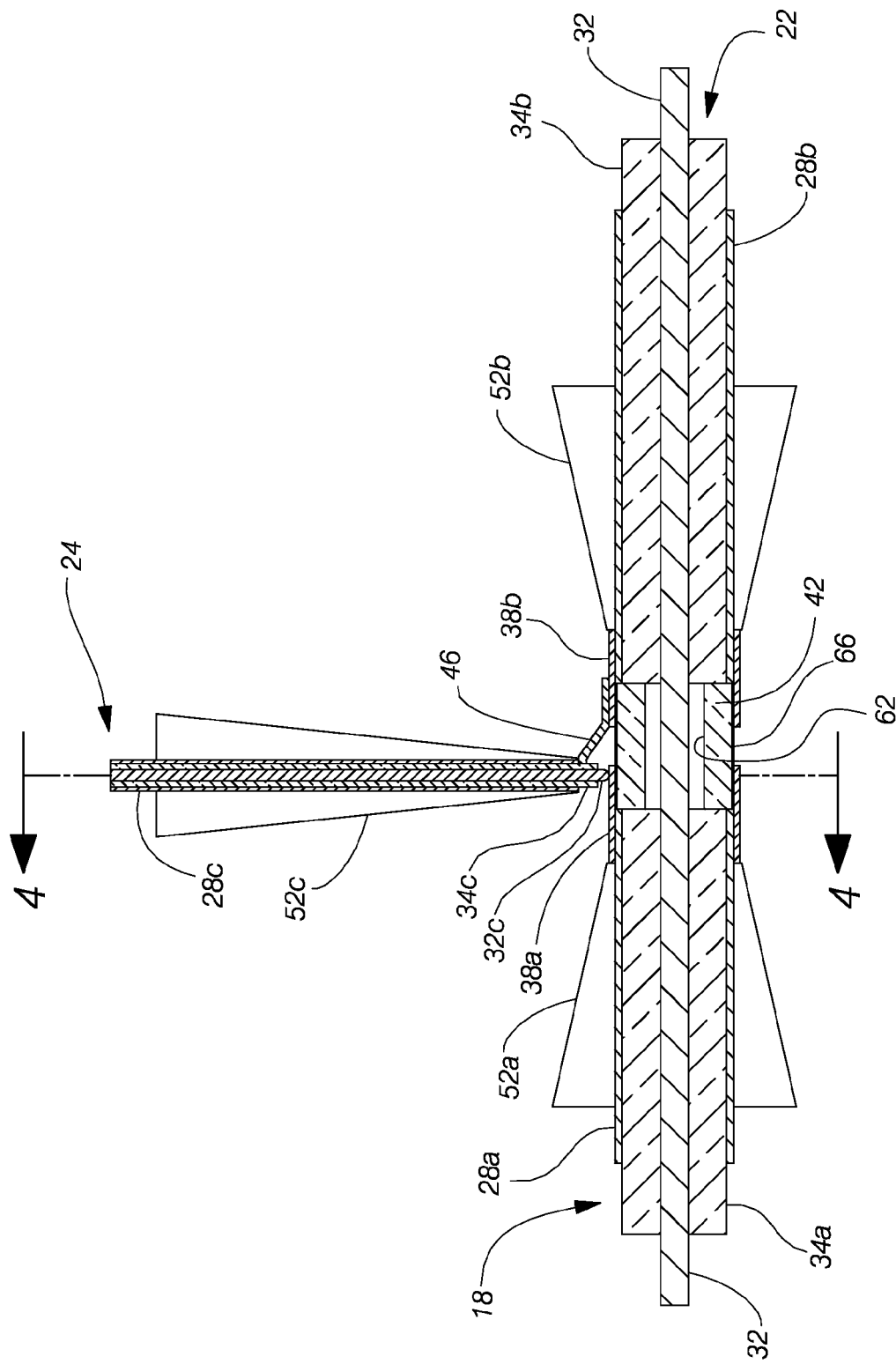
FIG. 3 illustrates an enlarged cross-sectional view similar to FIG. 2, showing a current sensor take-off from a coaxial line in accordance with the present invention.

FIGS. 2 and 3 illustrate enlarged details regarding the junction formed by the current sensing resistor 42 and the three coaxial conductors 18, 22, 24. As is shown in FIG. 3, the tapered toroidal ferrites 52a, 52b substantially abut the respective resistor conductors 38a, 38b. Although not shown in the drawings, the tapered ferrites 52a, 52b can be placed closer to the current sensing resistor 42—such as by providing tapered ferrites of sufficient inner diameter to fit over the resistor conductor 38—to obtain even better capacitive isolation of the current sensing resistor junction with the output coaxial conductor. Such a closer ferrite location prevents the voltage developed across the current sensing resistor 42 from causing current to flow out onto the outer conductors 28a, 28b, 28c of the three coaxial conductors 18, 22, 24.

Figure 4:
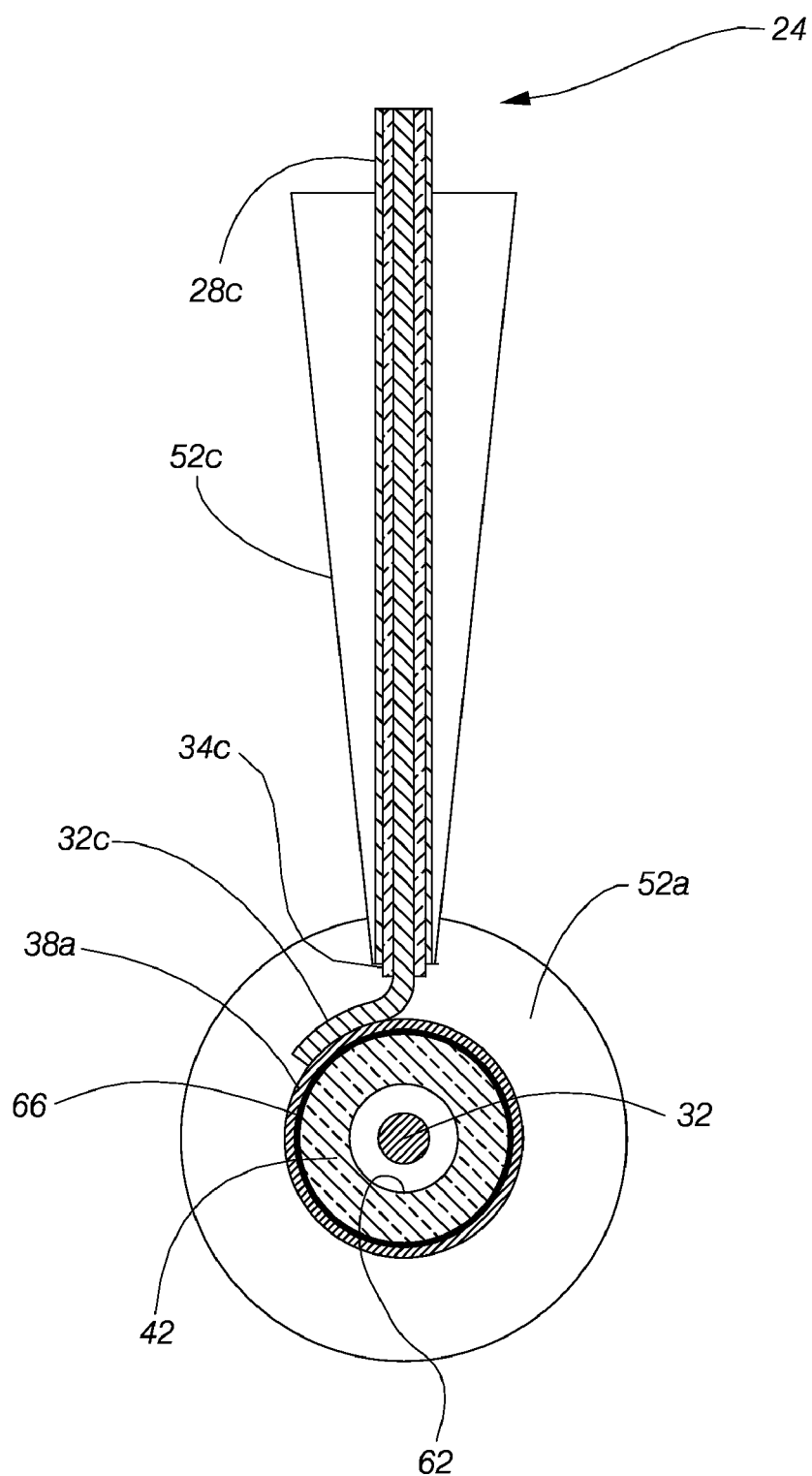
FIG. 4 illustrates a cross-sectional view, taken along the line 4-4 in FIG. 3, of a current sensor take-off from a coaxial line.

As illustrated in FIGS. 3 and 4, the current sensing resistor 42 is tubular, and has an inner sensing resistor diameter 62 of sufficient diameter to permit the inner conductor 32 to extend through the current sensing resistor 42 without interruption and to be spaced apart from the current sensing resistor 42. As shown in FIG. 3, in preferred embodiments, a glass tube having a continuous outer resistance film 66 formed thereon may be used as the sensing resistor 42. The resistance film 66 has a low temperature coefficient of resistance for high stability measurements. The tube has an outer diameter of about 0.260 inches and has a hole through the center having an inner diameter sufficient to permit passage of the center or inner conductor 32 of the coaxial line. The sensing resistor 42 preferably has a length between the resistor conductors 38a, 38b that is sufficiently short so that the electrical length of the sensing resistor 42 is no longer than the rise time of the signal to be sensed so that variations in the impedance to ground at different ends of the resistor do not affect the current flowing through the resistor. For example, an electrical length of approximately 0.35 inches between the conductors is advantageously selected for sensing signals having rise times as short as approximately 30 picoseconds. Preferably, the resistor thickness has a uniform skin depth at the highest frequency of the signals to be measured to provide a constant resistance at all rise times of currents passing through the resistor. In another advantageous embodiment, the resistor 42 comprises a plurality of discrete chip resistors electrically connected between the outer conductor 28a and the outer conductor 28b. For example, in one embodiment, ten 5-ohm resistors having a length of approximately 0.0625 inch are soldered to the outer conductors to provide a 0.5-ohm sensing resistor.

In a presently preferred embodiment, two short pieces of Teflon® insulated 0.250-inch outer diameter copper coaxial cable connect to either end of the current sensing resistor. The Teflon® brand polymer compound is presently preferred because the compound has a low loss and has the ability to withstand the heat generated by direct soldering. The dielectric constant of the resistor substrate, the outer and inner diameters of the resistor substrate, and the size of the inner conductor 32 of the coaxial conductor passing through are chosen to maintain the constant 50-ohm impedance throughout the entire coaxial current sensor. Additional impedance compensation can be obtained by placing plastic sleeves (not shown in the drawings) over the inner coaxial conductor 32 to achieve the constant 50-ohm impedance.

The dimensions and the impedance compensation are determined by the diameter of the inner conductor 32—in the illustrated embodiment, the inner conductor 32 is a silver-plated copper conductor having a diameter of approximately 0.064 inch and is positioned coaxially within a 0.250-inch outer diameter copper jacket. By careful design of the current sensing resistor section 42, any impedance discontinuity in the short length of cylindrical resistor substrate is minimized. If the coaxial transitions to the resistor substrate are designed for minimum impedance discontinuities and the impedance through this section is controlled, the only unavoidable impedance discontinuity is the abrupt increase in coaxial line impedance at the location of the resistor 42, which is determined by the amount of series resistance added to the transmission line by the resistor. The entrance resistor conductor 38a and the exit resistor terminal 38b advantageously comprise brass terminals, which are pressed onto the current sensing resistor terminals or film to provide stable low resistance terminations that can be soldered to the copper coax outer conductors 28a, 28b. This structure permits very high-speed coaxial current measurements of the total current flowing in both directions through the transmission line.

Further distortion reduction in the measurement of the bidirectional current flow is advantageously obtained by making the electrical length of the current sensing resistor about one-third the electrical length of the fastest rise time to be measured. An electrical length of about 8 picoseconds for the sensing resistor provides better than 30-picosecond rise time response capability for currents flowing in either direction. Accordingly, the current-to-voltage transducer described herein provides an external output signal that is useable at an external port or connection with minimal distortion of the very fast rise time of the current flowing through the transmission line.

Three close-fitting tapered ferrites on each of the three coaxial lines have been shown to preserve the fastest possible current rise time measurement. When a longer pulse measurement is required, higher loss ferrites with higher permeability can be placed around the main coaxial line outer conductor 28a on the side connected to the inner conductor of the current sensor output coaxial line, as shown, for example, in FIG. 5.

For improved pulse response at longer times, high permeability magnetic tape wound cores placed around this coaxial line or low frequency transformer laminations can be used after the tapered ferrites used for the fastest pulse isolation.

By forcing the fastest rise time pulse to remain inside the output coax and to be isolated from losses, higher loss ferrites or other metallic materials located after the low loss ferrites will not degrade the rise time speed. Such higher permeability materials can also completely fill the space between the coaxial line and the inside of the metal shield. Higher inductance following the high frequency tapered ferrites will increase the isolation of slower parts of the measured current pulse.

The slower pulse energy that leaks past the low loss ferrites is stopped by the higher permeability materials that isolate the slower part of the pulse from the grounded shield. This physical arrangement provides an additional advantage. Long time pulse response of this current sensor is determined by the L/R time. With a low resistance resistor R, the long time response, or the percent of droop that determines the accuracy at long time periods, can be made to be as long as is required by adding low frequency inductance (L) to this side of the sensed coaxial line.

The output coaxial line 24 carrying the sensed current waveform outside the grounded sensor housing is preferably a short length of Teflon® insulated 0.085-inch diameter copper jacket coax. The smaller diameter coax with smaller diameter tapered ferrites isolating it from the ground has minimal capacitance to the ground plane and preserves the fastest possible rise time.

A metal ground housing surrounds the main coaxial lines, the output coaxial line, and the current sensing resistor and ferrites. The outer conductor of each of the three coaxial lines is electrically connected to the ground housing. To minimize the shunt capacitance to ground across all elements in the current sensing circuit, the dimensions of the inside of the metal ground housing preferably at least about 5 times that of the outer diameter of the coaxial line and current sensing resistor. Such dimensioning has been found sufficient to achieve high fidelity 30-picosecond pulse response capability. Preferably, the current sensing resistor is positioned substantially in the center of the housing to maintain a substantially constant characteristic impedance.

The present invention is disclosed herein in terms of a preferred embodiment thereof, which provides a pulse coaxial current sensor that is of great novelty and utility. Various changes, modifications, and alterations in the teachings of the present invention may be contemplated by those skilled in the art without departing from the intended spirit and scope thereof. It is intended that the present invention encompass such changes and modifications.

We claim:

1. A sensor to measure high frequency currents, comprising:
    a first coaxial transmission line comprising an inner conductor and an outer conductor, the outer conductor having a first portion and a second portion, the inner conductor being continuous within the first portion and the second portion, the first portion and the second portion of the outer conductor being electrically discontinuous, the first coaxial transmission line having a characteristic impedance;
    a sensing resistance section positioned around the inner conductor of the first coaxial transmission line between the first portion and the second portion of the outer conductor of the first coaxial transmission line, the sensing resistance section having a first terminal electrically connected to the first portion of the outer conductor of the first coaxial transmission line and having a second terminal electrically connected to the second portion of the outer conductor of the first coaxial transmission line, the sensing resistance section having a characteristic impedance approximately the same as the characteristic impedance of the first coaxial transmission line; and
    a second coaxial transmission line having an inner conductor electrically connected to the first terminal of the sensing resistance section and having an outer conductor with a terminal portion electrically connected to the second terminal of the resistance section.

2. A sensor to measure high frequency currents, comprising:
    a first coaxial transmission line comprising an inner conductor and an outer conductor, the outer conductor having a first portion and a second portion, the inner conductor being continuous within the first portion and the second portion, the first coaxial transmission line having a characteristic impedance;
    a sensing resistor positioned around the inner conductor of the first coaxial transmission line between the first portion and the second portion of the outer conductor of the first coaxial transmission line, the sensing resistor having a first terminal electrically connected to the first portion of the outer conductor of the first coaxial transmission line and having a second terminal electrically connected to the second portion of the outer conductor of the first coaxial transmission line, the sensing resistor having a resistance much lower than the characteristic impedance of the first coaxial transmission line;
    a second coaxial transmission line having an inner conductor electrically connected to the first terminal of the sensing resistor and having an outer conductor with a terminal portion electrically connected to the second terminal of the sensing resistor; and
    an electrically conductive housing that encloses the sensing resistor, a selected length of the first coaxial transmission line and a selected length of the second coaxial transmission line, the electrically conductive housing being electrically connected to the first portion and the second portion of the outer conductor of the first coaxial transmission line and to the outer conductor of the second coaxial transmission line.

3. The sensor as defined in claim 2, wherein the first outer conductor of the first coaxial transmission line has an outer diameter, and wherein the housing has inner dimensions at least about five times the outer diameter of the first outer conductor of the first coaxial transmission line.

4. The sensor as defined in claim 2, further comprising:
    a first toroidal ferrite positioned on the first portion of the outer conductor of the first coaxial transmission line between the sensing resistor and a first wall of the housing;
    a second toroidal ferrite positioned on the second portion of the outer conductor of the first coaxial transmission line between the sensing resistor and a second wall of the housing; and
    a third toroidal ferrite positioned on the outer conductor of the second coaxial transmission line between the sensing resistor and a third wall of the housing.

5. The sensor as defined in claim 4, wherein:
    the first toroidal ferrite has an inside diameter selected to closely match an outside diameter of the first portion of the outer conductor of the first coaxial transmission line;

the second toroidal ferrite has an inside diameter selected to closely match an outside diameter of the second portion of the outer conductor of the first coaxial transmission line; and the third toroidal ferrite has an inside diameter selected to closely match an outside diameter of the outer conductor of the second coaxial transmission line.

6. The sensor as defined in claim 4, wherein:

the first toroidal ferrite is tapered from a larger end to a smaller end, the first toroidal ferrite positioned with the smaller end proximate the first terminal of the sensing resistor;

the second toroidal ferrite is tapered from a larger end to a smaller end, the second toroidal ferrite positioned with the smaller end proximate the second end of the sensing resistor; and the third toroidal ferrite is tapered from a larger end to a smaller end, the third toroidal ferrite positioned with the smaller end proximate the terminal portion of the outer conductor of the second coaxial transmission line.

7. The sensor as defined in claim 6, further comprising at least a fourth toroidal ferrite positioned on the first portion of the outer conductor of the first coaxial transmission line between the first toroidal ferrite and the first wall of the housing.

8. A sensor to measure high frequency currents, comprising:

a first coaxial transmission line comprising an inner conductor and an outer conductor, the outer conductor having a first portion and a second portion, the inner conductor being continuous within the first portion and the second portion, the first coaxial transmission line having a characteristic impedance;

a sensing resistor positioned around the inner conductor of the first coaxial transmission line between the first portion and the second portion of the outer conductor of the first coaxial transmission line, the sensing resistor having a first terminal electrically connected to the first portion of the outer conductor of the first coaxial transmission line and having a second terminal electrically connected to the second portion of the outer conductor of the first coaxial transmission line, the sensing resistor having a resistance much lower than the characteristic impedance of the first coaxial transmission line; wherein the sensing resistor is a single tubular resistor comprising:

a cylindrical tube comprising an inner wall and an outer wall, the inner wall having an inner diameter larger than an outer diameter of the inner conductor of the first coaxial transmission line, the outer wall having an outer diameter approximately the same as an outer diameter of the outer conductor of the first coaxial transmission line;

an electrically resistive film formed on at least a portion of the outer wall of the cylindrical tube; and a first contact connected to the electrically conductive film proximate a first end of the cylindrical tube and a second contact connected to the electrically conductive film proximate a second end of the cylindrical tube, the first contact and the second contact being spaced apart by a distance selected to provide a predetermined resistance in the electrically conductive film between the first contact and the second contact; and a second coaxial transmission line having an inner conductor electrically connected to the first terminal of the sensing resistor and having an outer conductor with a terminal portion electrically connected to the second terminal of the sensing resistor.

9. The sensor as defined in claim 8, wherein the electrically resistive film has a low temperature coefficient of resistance.

10. The sensor as defined in claim 8, wherein:

the cylindrical tube has a dielectric constant; and the dielectric constant, the inner diameter of the cylindrical tube, the outer diameter of the cylindrical tube and the outer diameter of the inner conductor of the first coaxial transmission line are selected to substantially match the impedance of the sensing resistor with the characteristic impedance of the first coaxial transmission line.

11. The sensor as defined in claim 8, wherein the cylindrical tube comprises glass.

12. The sensors as defined in claim 8, wherein the sensing resistor has an electrical length no longer than a rise time of a signal to be sensed.

* * * * *